(12) United States Patent  
Imazu et al.

(10) Patent No.: US 9,269,873 B2
(45) Date of Patent: Feb. 23, 2016

(54) SEMICONDUCTOR LIGHT EMITTING DEVICE AND METHOD FOR MANUFACTURING SAME

(71) Applicants: CITIZEN HOLDINGS CO., LTD., Tokyo (JP); CITIZEN ELECTRONICS CO., LTD., Yamanashi (JP)

(72) Inventors: Kenji Imazu, Saitama (JP); Hirohiko Ishii, Yamanashi (JP)

(73) Assignees: CITIZEN HOLDINGS CO., LTD., Tokyo (JP); CITIZEN ELECTRINICS CO., LTD., Yamanashi (JP)

(*) Notice: Subject to any disclaimer, the term of this patent is extended or adjusted under 35 U.S.C. 154(b) by 0 days.

(21) Appl. No.: 14/384,156

(22) PCT Filed: Mar. 13, 2013

(86) PCT No.: PCT/JP2013/057089
§ 371 (c)(1),
(2) Date: Sep. 9, 2014

(87) PCT Pub. No.: WO2013/137356
PCT Pub. Date: Sep. 19, 2013

(65) Prior Publication Data
US 2015/0050760 A1      Feb. 19, 2015

(30) Foreign Application Priority Data
Mar. 13, 2012   (JP) .................... 2012-055648

(51) Int. Cl.
*H01L 21/00* (2006.01)
*H01L 33/52* (2010.01)
(Continued)

(52) U.S. Cl.
CPC ............ *H01L 33/52* (2013.01); *H01L 33/0095* (2013.01); *H01L 33/486* (2013.01);
(Continued)

(58) Field of Classification Search
CPC ............... H01L 2924/12041; H01L 25/0753; H01L 33/50; H01L 33/52; H01L 33/486; H01L 33/0095
See application file for complete search history.

(56) References Cited

U.S. PATENT DOCUMENTS

| 2005/0093007 A1 | 5/2005 | Steigerwald et al. |
| 2006/0054913 A1 | 3/2006 | Hadame et al. |

(Continued)

FOREIGN PATENT DOCUMENTS

| JP | 2002-261325 A | 9/2002 |
| JP | 2005-79550 A | 3/2005 |

(Continued)

OTHER PUBLICATIONS

International Search Report for PCT Application No. PCT/JP2013/057089, May 14, 2013.

*Primary Examiner* — Mary Wilczewski
*Assistant Examiner* — Erik T Peterson

(57) ABSTRACT

A method for manufacturing a semiconductor light emitting device comprises steps of: arraying semiconductor light emitting elements on an adhesive sheet so that electrodes of the semiconductor light emitting elements face the adhesive sheet; forming a wafer thereof by filling spaces between side surfaces of the semiconductor light emitting elements arrayed on the adhesive sheet with a resin and curing the resin; peeling the adhesive sheet from the wafer; overlaying the wafer on a substrate from which numerous substrates can be obtained by subdivision into individual pieces and the electrodes of the semiconductor light emitting elements and electrodes formed on the large circuit substrate are joined; and subdividing the large circuit substrate, to which the wafer has been joined, into individual semiconductor light emitting devices so that the planar size of the semiconductor light emitting element and that of the circuit substrate are roughly equal.

4 Claims, 8 Drawing Sheets

(51) Int. Cl.
  *H01L 33/50*  (2010.01)
  *H01L 33/48*  (2010.01)
  *H01L 33/00*  (2010.01)
  *H01L 33/60*  (2010.01)
  *H01L 33/46*  (2010.01)
  *H01L 33/56*  (2010.01)
(52) U.S. Cl.
  CPC ............... *H01L 33/50* (2013.01); *H01L 33/46* (2013.01); *H01L 33/56* (2013.01); *H01L 33/60* (2013.01); *H01L 2933/005* (2013.01); *H01L 2933/0025* (2013.01); *H01L 2933/0033* (2013.01); *H01L 2933/0041* (2013.01)

(56) References Cited

U.S. PATENT DOCUMENTS

| 2006/0171152 | A1* | 8/2006 | Suehiro et al. | 362/363 |
| 2010/0171215 | A1* | 7/2010 | Fischer et al. | 257/734 |
| 2013/0187174 | A1* | 7/2013 | Tischler | 257/80 |

FOREIGN PATENT DOCUMENTS

| JP | 2005-136420 A | 5/2005 |
| JP | 2007-27585 A | 2/2007 |
| JP | 2008-60166 A | 3/2008 |

* cited by examiner

SEMICONDUCTOR LIGHT EMITTING DEVICE AND METHOD FOR MANUFACTURING SAME

TECHNICAL FIELD

The present invention relates to a semiconductor light emitting device and a method for manufacturing the same, and particularly, relates to a semiconductor light emitting device in which a semiconductor light emitting element is flip-chip mounted on a circuit substrate and which emits light in a color different from the color of light emitted from the semiconductor light emitting element by a phosphor, and a method for manufacturing the same.

BACKGROUND

A packaged semiconductor light emitting device (hereinafter, referred to as an "LED device" unless specified otherwise in particular) has been widely spread, in which a semiconductor light emitting element (hereinafter, referred to as an "LED die" unless specified otherwise in particular) cut out from a wafer is mounted on a lead frame or a circuit substrate and which is covered with a resin, glass, etc. There are a variety of aspects of the LED device in accordance with its use and there is a case where the planar size of the circuit substrate and that of the LED die are made substantially equal when the package is downsized. The package is one aspect of the chip size package (also referred to as CSP).

FIG. 10 is a section view illustrating a conventional light emitting diode.

FIG. 10 is a diagram illustrating FIG. 1 described in Patent Literature 1. The light emitting diode is connected onto a submount 118 (circuit substrate) by interconnection 117 in the state where a chip (LED die) is reversed (flip-chip). The chip is configured by stacking a substrate 110, an n-type semiconductor layer 112, an active region 114, a p-type region 115, and a contact 116 in the downward direction in FIG. 10. The top surface and the side surface of the chip are covered with phosphorescent layers 120 and 119 (phosphors).

The light emitting diode illustrated in FIG. 10 aims at improvement of light emission efficiency, and therefore, the sub mount 118 is drawn in a simplified manner, but the characteristic feature lies in that there is no underfill between the chip and the sub mount 118.

Patent Literature 1: Japanese Unexamined Patent Publication (Kokai) No. 2005-136420

SUMMARY

If there is underfill, in the case where an LED device having adopted the flip-chip mount is mounted on the mother substrate, the underfill expands and contracts due to high temperatures in the reflow process and there may be a case where the semiconductor layer formed on the undersurface of the LED die is broken. In contrast to this, if there is no underfill itself as in the light emitting diode illustrated in FIG. 10, such trouble will not occur, but the manufacturing method thereof is not described in Patent Literature 1.

It is possible to manufacture a desired light emitting diode by fixing the submount 118 (circuit substrate) on a base etc. and mounting the chip by the flip-chip mount, as is often performed in, for example, experiments or trial manufacture. However, by the method such as this, the process is such that one circuit substrate (submount 118) is picked up and one LED die (chip) is mounted thereon, and therefore, time and effort are required and the method is not suitable for mass production.

Further, the light emitting diode illustrated in FIG. 10 radiates light not only from the top surface of the LED die (chip) but also from the side surface. Light radiated from the side surface cannot be utilized as it is, and therefore, it is necessary to direct the light in the direction toward the top surface by some means.

Furthermore, in the light emitting diode illustrated in FIG. 10, the bottom surface of the LED die (chip) is exposed. In general, the semiconductor layer of the LED die is covered with a protective film (also referred to as an insulating film), and therefore, it is inferred that the light emitting diode illustrated in FIG. 10 includes a protective film on the bottom surface although not illustrated schematically. However, even when there exists a protective film, if the bottom surface of the LED die is exposed, there is a possibility that a pin hole etc. exists in the protective film, and therefore, there arises such trouble that reliability of the light emitting diode cannot be guaranteed.

An object of the present invention is to provide a method for manufacturing a semiconductor light emitting device in which a gap is provided appropriately between a semiconductor light emitting element and a circuit substrate and light is radiated toward the top surface side when the planar size of the semiconductor light emitting element and that of the circuit substrate on which the semiconductor light emitting element is flip-chip mounted are made substantially equal.

Further, another object of the present invention is to provide a semiconductor light emitting device whose reliability can be improved, in which a gap is provided appropriately between a semiconductor light emitting element and a circuit substrate and light is radiated toward the top surface side when the planar size of the semiconductor light emitting element and that of the circuit substrate on which the semiconductor light emitting element is flip-chip mounted are made substantially equal.

A method for manufacturing a semiconductor light emitting device including a semiconductor light emitting element having an electrode, a circuit substrate mounting the semiconductor light emitting element, and a phosphor layer that converts the wavelength of light emitted from the semiconductor light emitting element, the method includes the steps of arraying a plurality of the semiconductor light emitting elements on an adhesive sheet with the electrodes of the semiconductor light emitting elements being caused to face the adhesive sheet side, filling spaces between the side surfaces of the semiconductor light emitting elements arrayed on the adhesive sheet with a resin; creating a semiconductor light emitting element wafer by curing the resin; peeling the adhesive sheet from the semiconductor light emitting element wafer, overlaying the semiconductor light emitting element wafer on a large-sized circuit substrate from which numerous circuit substrate can be obtained by division into individual pieces and joining the electrodes of the semiconductor light emitting elements and electrodes formed on the large-sized circuit substrate, and dividing the large-sized circuit substrate to which the semiconductor light emitting element wafer has been joined into individual semiconductor light emitting devices so that the planar of the semiconductor light emitting element and the planar size of the circuit substrate are equal.

In the method for manufacturing a semiconductor light emitting device, first, the semiconductor light emitting elements are arrayed on the adhesive sheet, and the side surfaces of the semiconductor light emitting elements are covered with a resin, such as a reflecting member, and then the semiconductor light emitting element wafer is created. Subsequently, the semiconductor light emitting element wafer is overlaid on the large-sized circuit substrate from which circuit substrate can be obtained by division into individual pieces and then both are joined. Finally, by cutting the large-sized circuit substrate in the state where the semiconductor light emitting element wafer is stacked, it is possible to obtain a large number of semiconductor light emitting devices at one time.

Further, preferably, the method for manufacturing a semiconductor light emitting device further includes forming the phosphor layer on the top surface of the semiconductor light emitting element.

Further, in the method for manufacturing a semiconductor light emitting device, preferably, the resin is a reflecting member.

Further, in the method for manufacturing a semiconductor light emitting device, it is preferable to fill spaces between the side surfaces of the semiconductor light emitting elements arrayed on the adhesive sheet and spaces between the adhesive sheet and the semiconductor light emitting elements with a reflecting member.

Further, in the method for manufacturing a semiconductor light emitting device, preferably, the resin is a translucent resin, and the method further includes forming the phosphor layer at the top part of the semiconductor light emitting element and the translucent resin, removing the phosphor layer and the translucent resin at the side part of the semiconductor light emitting element in such a manner as to leave a layer including the translucent region on the side surface of the semiconductor light emitting element, and filling the portion from which the phosphor layer and the translucent resin at the side part of the semiconductor light emitting element have been removed with a reflecting member.

Further, in the method for manufacturing a semiconductor light emitting device, preferably, the resin is a phosphor resin containing a phosphor, and spaces between the side surfaces of the semiconductor light emitting elements arrayed on the adhesive sheet are filled with the phosphor resin and at the same time, a phosphor layer is formed on the top surface of the semiconductor light emitting element by the phosphor resin.

Further, preferably, the method for manufacturing a semiconductor light emitting device further includes removing the phosphor resin at the side part of the semiconductor light emitting element in such a manner as to leave a layer including the phosphor resin on the side surface of the semiconductor light emitting element and filling the portion from which the phosphor resin at the side part of the semiconductor light emitting element has been removed with a reflecting member.

Further, in the method for manufacturing a semiconductor light emitting device, it is preferable to fill spaces between the adhesive sheet and the semiconductor light emitting elements with the phosphor resin.

Further, in the method for manufacturing a semiconductor light emitting device, preferably, the phosphor layer is a phosphor sheet containing a phosphor.

Further, in the method for manufacturing a semiconductor light emitting device, it is preferable to cause the electrodes of the plurality of semiconductor light emitting elements to face the adhesive sheet side and to array the semiconductor light emitting elements on the adhesive sheet so that the electrodes of the semiconductor light emitting elements sink into the adhesive layer of the adhesive sheet.

A semiconductor light emitting device includes, a circuit substrate, a semiconductor light emitting element flip-chip mounted on the circuit substrate so as to have a gap between the semiconductor light emitting element and the circuit substrate, a phosphor layer that converts the wavelength of light emitted from the semiconductor light emitting element and which covers the top surface of the semiconductor light emitting element, and a resin including a reflecting member, a translucent resin, or a phosphor resin covering the side surface of the semiconductor light emitting element, and in that the planar size of the semiconductor light emitting element and the planar size of the circuit substrate are equal.

In the semiconductor light emitting device, the planar size of the flip-chip mounted semiconductor light emitting element and the planar size of the circuit substrate are substantially equal. Further, the side surface of the semiconductor light emitting element is covered with a resin, such as a reflecting member. In the case where the planar size of the outer shape of the resin, such as a reflecting member, thinly covering the side surface of the semiconductor light emitting element, and the planar size of the circuit substrate are made substantially equal, a semiconductor light emitting element wafer in which a plurality of semiconductor light emitting elements is coupled by the resin, such as a reflecting member, and a large-sized circuit substrate from which circuit substrates can be obtained by division into individual pieces are prepared and then the semiconductor light emitting element wafer and the large-sized circuit substrate are joined. Simultaneously, by cutting the large sized circuit substrate to which the semiconductor light emitting element wafer has been joined after forming the phosphor layer, it is possible to obtain a large number of desired semiconductor light emitting elements at one time.

Further, the semiconductor light emitting device includes a gap between the semiconductor light emitting element and the circuit substrate, and therefore, trouble related to underfill is unlikely to occur in the reflow process when mounting the semiconductor light emitting device onto the mother substrate and at the same time, the bottom surface of the semiconductor light emitting element is covered with a resin, such as a reflecting member, and therefore, the possibility of the occurrence of trouble related to the pinhole in the protective film that covers the semiconductor layer of the semiconductor light emitting element is reduced remarkably.

Further, in the semiconductor light emitting device, preferably, the resin is a reflecting member and the reflecting member covers the side surface of the phosphor layer.

Further, in the semiconductor light emitting device, preferably, the reflecting member covers the bottom surface of the semiconductor light emitting element.

Further, in the semiconductor light emitting device, preferably, the height of the bottom surface of the reflecting member that covers the bottom surface of the semiconductor light emitting element agrees with the height of the bottom surface of the electrode of the semiconductor light emitting element.

Further, in the semiconductor light emitting device, preferably, the resin is a translucent resin and further has a reflecting member that covers the translucent resin.

Further, in the semiconductor light emitting device, preferably, the resin is a phosphor resin and has a reflecting member that covers the phosphor resin.

Further, in the semiconductor light emitting device, preferably, the phosphor resin covers the bottom surface of the semiconductor light emitting element.

Further, in the semiconductor light emitting device, preferably, the phosphor layer is formed integrally by the phosphor resin.

Further, in the semiconductor light emitting device, preferably, the phosphor layer is a phosphor sheet containing a phosphor bonded to the semiconductor light emitting element.

In the method for manufacturing a semiconductor light emitting device, because the semiconductor light emitting element wafer and the large-sized circuit substrate are prepared, and desired semiconductor light emitting devices are obtained by cutting after joining the electrodes of both, the planar size of the semiconductor light emitting element and that of the circuit substrate are substantially equal, and therefore, the method is suitable for mass-production. Further, in the method for manufacturing a semiconductor light emitting device, a gap is provided appropriately between the semiconductor light emitting element and the circuit substrate. Because of this, by adopting a reflecting member as a member that couples the semiconductor light emitting elements on the semiconductor light emitting element wafer, it is possible to obtain a semiconductor light emitting device that radiates light only toward the top surface side.

In the semiconductor light emitting device, because the planar size of the semiconductor light emitting element and that of the circuit surface are made substantially equal, it is possible to apply the manufacturing method in which the semiconductor light emitting element wafer and the large-sized circuit substrate are prepared and desired semiconductor light emitting devices are obtained by cutting after joining the electrodes of both, and therefore, the semiconductor light emitting device is suitable for mass production. Further, in the semiconductor light emitting device, a gap is provided appropriately between the semiconductor light emitting element and the circuit substrate, and therefore, trouble known in relation to underfill does not occur at the time of the reflow process. Furthermore, in the semiconductor light emitting device, in the case where the side surface is covered with a reflecting member, it is possible to radiate light only in the direction toward the top surface side. Still furthermore, in the semiconductor light emitting device, in the case where the bottom surface of the semiconductor element is covered with a resin, such as a reflecting member, the possibility of the occurrence of trouble related to the pinhole in the protective film that covers the semiconductor layer of the semiconductor light emitting element is reduced, and therefore, reliability is improved.

EMBODIMENTS

Figure 1:
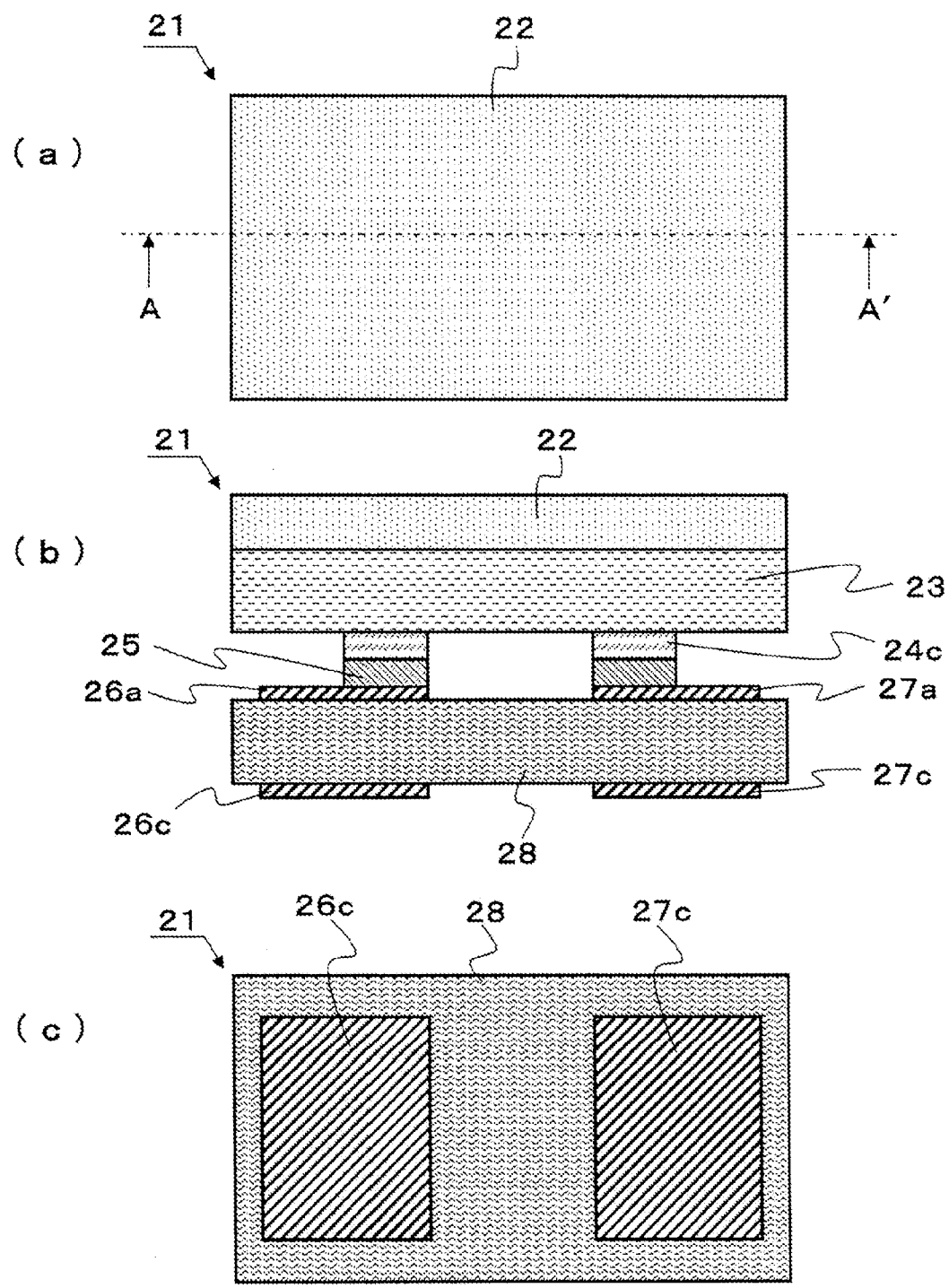
FIG. 1 is a full view of an LED device 21.

Hereinafter, with reference to drawings, an LED device is explained. However, the technical scope of the present invention is not limited to embodiments and it should be noted that the technical scope encompasses the inventions described in the claims and equivalents thereof. In explanation of the drawings, the same symbols are attached to the same or corresponding components and duplicated explanation is omitted.

FIG. 1A is a plan view of an LED device (semiconductor light emitting device) 21, FIG. 1B is a front view of the LED device 21, and FIG. 1C is a bottom view of the LED device 21.

As illustrated in FIG. 1A, when the LED device 21 is viewed from above, a rectangular phosphor sheet (phosphor layer) 22 is observed. As illustrated in FIG. 1B, when the LED device 21 is viewed from the front, under the phosphor sheet 22, a reflecting member (resin) 23, two LED electrodes (electrodes of semiconductor light emitting element) 24c, two connecting members 25, internal connecting electrodes (electrodes formed on circuit substrate) 26a and 27a, a circuit substrate 28, and external connecting electrodes 26c and 27c are observed. As illustrated in FIG. 1C, when the LED device 21 is viewed from the bottom surface, the external connecting electrodes 26c and 27c are observed inside an area occupied by the circuit substrate 28.

Figure 2:
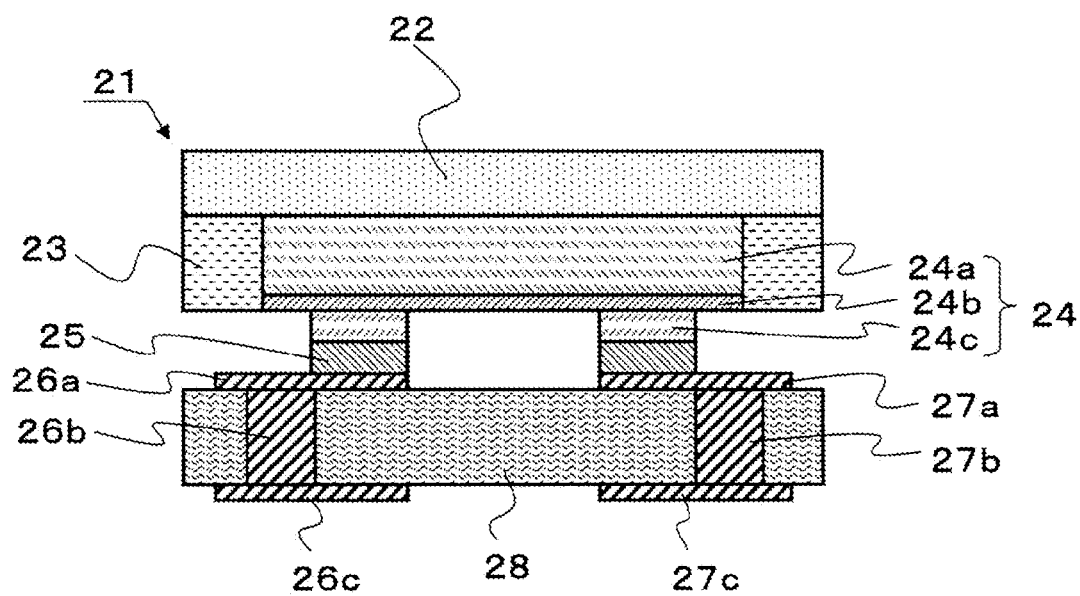
FIG. 2 is an AA' section view of FIG. 1.

FIG. 2 is an AA' section view of FIG. 1.

As illustrated in FIG. 2, the LED device 21 is configured so as to include the circuit substrate 28, an LED die 24 flip-chip mounted on the circuit substrate 28, and the reflecting member 23 and the phosphor sheet 22 that cover the LED die 24.

In the LED die 24, on the undersurface of a sapphire substrate 24a, a semiconductor layer 24b is formed and the LED electrode 24c is attached to the semiconductor layer 24b. The sapphire substrate 24a is a transparent insulating substrate and has a thickness of 80 to 120 μm. The semiconductor layer 24b includes an n-type semiconductor layer, a p-type semiconductor layer, and an insulating film, and has a thickness of slightly less than 10 μm. A light emitting layer is located at the boundary part between the n-type semiconductor layer and the p-type semiconductor layer and the planar shape of the light emitting layer is substantially equal to that of the p-type semiconductor layer.

An n-type semiconductor layer region (not illustrated) is a region exposed from the p-type semiconductor layer in order to establish electrical connection, but only a small area is given because it does not contribute to light emission, and therefore, if the LED electrode on the n side is formed in the n-type semiconductor layer region, the LED electrode on the n side becomes small in size. Consequently, by using the insulating film of the semiconductor layer 24b as an interlayer insulating film and by using a metal wire (not illustrated) formed on the insulating film (on the lower side in FIG. 2), the position and the planar size of the LED electrode 24c are adjusted so that the flip-chip mount is made easy. The metal wire is covered with a protective film (not illustrated). The LED electrode 24c is a bump electrode including Cu or Au as a core and has a thickness of about 10 to 30 μm.

The reflecting member 23 covering the side surface of the LED die 24 is formed by kneading reflecting fine particles of alumina or titanium oxide in a silicone resin and curing the silicone resin, and has a thickness of about 100 μm. The phosphor sheet 22 is formed by stretching a silicone resin containing a phosphor into the shape of a sheet and curing the silicone resin, and has a thickness of about 100 μm. The phosphor sheet 22 is caused to adhere to the top surface of the LED die 24 and to the top surface of the reflecting member 23.

The circuit substrate 28 is configured so as to include base materials, such as resin, metal, and ceramic, and has a thickness of about 100 to 300 μm. On the top surface of the circuit substrate 28, the internal connecting electrodes 26a and 27a are formed and on the undersurface of the circuit substrate 28, the external connecting electrodes 26c and 27c are formed. The internal connecting electrodes 26a and 27a are connected with the external connecting electrodes 26c and 27c via through-hole electrodes 26b and 27b.

The internal connecting electrodes 26a and 27a are connected with the LED electrode 24c via the connecting member 25. The connecting member 25 is configured by high melting point solder and consideration is taken so that the connecting member 25 does not melt even if heated in a reflow furnace when mounting the LED device 21 on the mother substrate (not illustrated). As the connecting member, it may also be possible to use a material that melts at the first reflow temperature, but after that, the melting point of which rises and no longer melts at the next reflow temperature. The connecting member such as this is suitable to the case where the LED electrode 24c and the internal connecting electrodes 26a and 27a are joined in the first-time reflow process and the external connecting electrodes 26c and 27c and the electrodes of the mother substrate are joined in the second-time reflow process.

FIG. 3A to FIG. 3G are diagrams illustrating a manufacturing process of the LED device 21. In the diagrams, the LED die 24 and the circuit substrate 28 are drawn in a simplified manner. In the manufacturing process, a large number of the LED devices 21 are manufactured at one time, but for explanation, in the diagrams, only the four LED dies 24 are illustrated.

First, a plurality of the LED dies 24 and an adhesive sheet 33 are prepared (see FIG. 3A), the LED electrodes 24c are caused to face the adhesive sheet 33 side, and the LED dies 24 are arrayed on the adhesive sheet 33 (see FIG. 3B) (element array process). The adhesive sheet 33 includes an adhesive layer 31 on a base material 32 made of resin. In the present manufacturing process, in order to secure a state where the LED electrode 24 protrudes, the LED electrode 24 is sunk into the adhesive layer 31 so that the reflecting member 23 is prevented from sticking to the bottom surface of the LED die 24. In the case where the LED electrode 24c is sunk, it may also be possible to press down the LED electrode 24c into the adhesive layer 31 each time each individual LED die 24 is arranged on the adhesive sheet 33 or to arrange all the LED dies 24 on the adhesive sheet 33 and then to press down all the LED electrodes 24c into the adhesive layer 31 at one time.

Usually, there is a process for ranking the LED dies 24 based on the light emitting characteristics and in the ranking process, the LED dies 24 are picked up and arrayed. Consequently, in the ranking process, it is recommended to array the LED dies 24 on the adhesive sheet 33 at predetermined pitches (electrode pitches of a large-sized circuit substrate 35, to be described later). Further, it may also be possible to array the LED dies 24 at desired pitches so that the sapphire substrate 24a sides adhere to another adhesive sheet and then to transfer the LED dies 24 from the other adhesive sheet to the adhesive sheet 33.

Next, spaces between the side surfaces of the LED dies 24 arrayed on the adhesive sheet 33 are filled with the reflecting member 23 and an LED wafer 34 (semiconductor light emitting element wafer) is created by curing the filled reflecting member 23 (see FIG. 3C) (reflecting member filling process, which is part of element wafer creation process). Spaces between the LED dies 24 are filled with an appropriate amount of the reflecting member 23 before cured by a dispenser and then the reflecting member 23 is cured. It may also be possible to fill spaces between the LED dies 24 with the reflecting member 23 before cured by using a die and then to heat and cure the reflecting member 23. Further, it may also be possible to fill spaces between the LED dies 24 with the reflecting member 23 with a squeegee and then to heat and cure the reflecting member 23. Molding by a die may be the depression method or the injection method. Here, if the reflecting member 23 is filled by molding or by using a squeegee, the reflecting member 23 sticks also to the top surface of the LED die 24, and therefore, it is necessary to grind the top surface of the LED wafer 34 after curing the reflecting member 23. The curing temperature of the reflecting member 23 is about 150° C. In the case where the joining temperature in the joining process, to be described later, is high, it may also be possible to use a vitreous material, such as organopolysiloxane, as the binder of the reflecting member 23 in place of the silicone resin.

Next, the phosphor sheet 22 is bonded to the top surface of the LED die 24 (see FIG. 3D) (phosphor layer forming process, which is part of element wafer creation process). First, a transparent adhesive is applied onto the LED wafer 34 and next, the large-sized phosphor sheet 22 is bonded thereto. In the present manufacturing process, the phosphor sheet 22 is bonded immediately after forming the LED wafer 34, but it may also be possible to bond the phosphor sheet 22 after the joining process, to be described later. In the case where the phosphor sheet 22 is bonded before the joining process, the LED wafer 34 is reinforced by the phosphor sheet 22 and it is made easy to handle the LED wafer 34. In contrast to this, in the case where the phosphor sheet 22 is bonded after the joining processing, there is an advantage that the phosphor in the phosphor sheet 22 does not deteriorate due to high temperatures during the joining process. Further, in the present manufacturing process, as a phosphor layer, the phosphor sheet 22 is used, but it may also be possible to form the phosphor layer by applying a resin containing a phosphor onto the LED wafer 34. Furthermore, it may also be possible to improve the heat resistance of the phosphor layer by using a vitreous material, such as organopolysiloxane, as the binder of the phosphor layer.

Next, the adhesive sheet 33 is peeled from the LED wafer 34 (see FIG. 3E), the LED wafer 34 is overlaid on the large-sized circuit substrate 35 from which the numerous circuit substrates 28 can be obtained by division into individual pieces, and the LED electrodes 24c and the electrodes formed on the large-sized circuit substrate 35 (internal connecting electrodes 26a and 27a (see FIG. 1 and FIG. 2)) are joined (see FIG. 3F) (joining process). The adhesive sheet 33 is heated in the process for creating the LED wafer 34 etc., and therefore, a type that loses adhesion when irradiated with ultraviolet rays is used instead of a type that loses adhesion when heated. After irradiating the adhesive sheet 33 with ultraviolet rays etc. so as to lose adhesion, the adhesive sheet 33 is peeled from the LED wafer 34. At the same time as this, on the internal connecting electrodes 26a and 27a of the large-sized circuit substrate 35, high melting point solder paste is printed. The positions of the LED electrodes 24c protruding from the LED wafer and the positions of the internal connecting electrodes 26a and 27a on the large-sized circuit substrate 35 are aligned, then the LED wafer 34 and the large-sized circuit substrate 35 are overlaid, and the LED electrodes 24c and the internal connecting electrodes 26a and 27a are joined by heating. In the case where a warp is produced due to heating during joining, it is recommended to apply heat in the state where the top surface of the LED wafer 34 and the undersurface of the large-sized circuit substrate 35 are held by a metal flat plate (not illustrated).

Finally, the large-sized circuit substrate 35 to which the LED wafer 34 including the phosphor sheet 22 on the top surface of the LED dies 24 has been joined is divided into individual pieces, and thus the LED devices 21 are obtained (see FIG. 3G) (individualization process). The large-sized circuit substrate 35 in which the phosphor sheet 22 and the LED wafer 34 are stacked is bonded to a dicing sheet (not illustrated) and cut by a dicer. At this time, it may also be possible to make a blade to cut the phosphor sheet 22 and the reflecting member 23 differ from a blade to cut the large-sized circuit substrate 35. In the case where the blades are made to differ from each other, in the LED device 21, the outline of the circuit substrate 28 is somewhat larger than the outline of the reflecting member 23.

FIG. 4A is a plan view of another LED device 41 and FIG. 4B is a front view of the LED device 41.

In the LED device 21, the reflecting member 23 covers only the side surface of the LED die 24. However, the LED device 41 is configured so that a reflecting member 43 covers regions other than the light radiating surface and the electrical connection parts. Further, in the LED device 21, the LED electrode 24c protrudes from the bottom surface of the LED die 24. However, the LED device 41 is configured so that an LED electrode 44c does not protrude at the bottom surface of the LED die.

As illustrated in FIG. 4A, when the LED device 41 is viewed from above, a phosphor sheet (phosphor layer) 42 is observed inside the frame-shaped reflecting member 43. As illustrated in FIG. 4B, when the LED device 41 is viewed from the front, under the reflecting member 43, two connecting members 45, the internal connecting electrodes (electrodes formed on circuit substrate) 26a and 27a, the circuit substrate 28, and the external connecting electrodes 26c and 27c are observed. The internal connecting electrodes 26a and 27a, the external connecting electrodes 26c and 27c, and the through-hole electrodes 26b and 27b relating to the circuit substrate 28 (see FIG. 5) are the same as the electrodes of the circuit substrate 28 of the LED device 21 (see FIG. 1 and FIG. 2).

Figure 4:
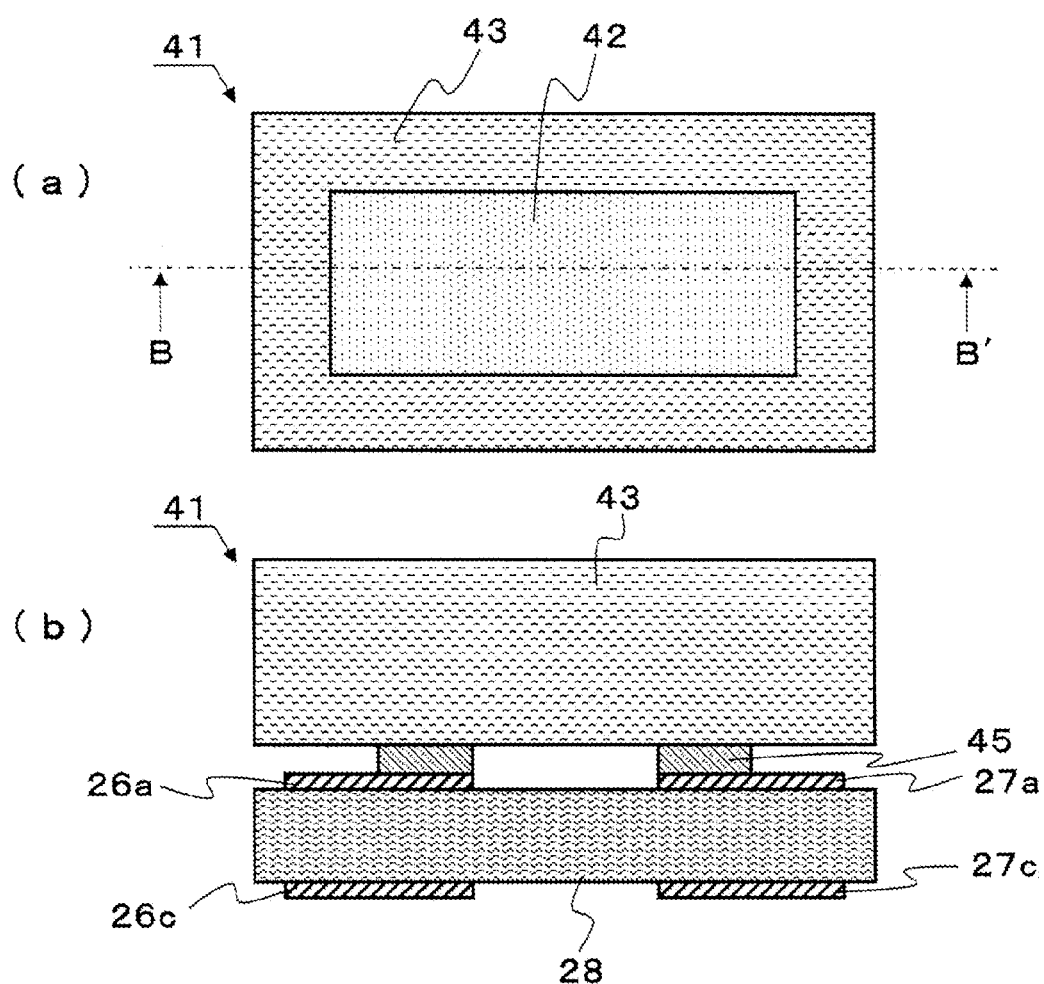
FIG. 4 is a full view of another LED device 41.
Figure 5:
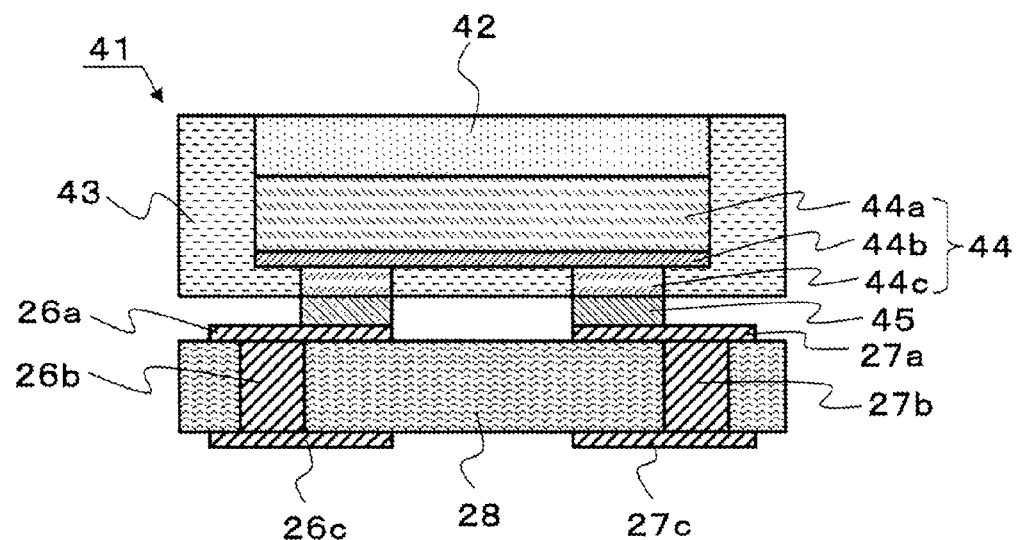
FIG. 5 is a BB' section view of FIG. 4.

FIG. 5 is a BB' section view of FIG. 4.

As illustrated in FIG. 5, the LED device 41 is configured so as to include the circuit substrate 28, an LED die 44 flip-chip mounted on the circuit substrate 28, the reflecting member 43 covering the LED die 44, and the phosphor sheet 42 like the LED device 21 illustrated in FIG. 2. The phosphor sheet 42 covers only the top surface of the LED die 44. The reflecting member 43 covers the side surface of the LED die 44, the bottom surface of the LED die 44, and the side surface of the phosphor sheet 42.

A sapphire substrate 44a and a semiconductor layer 44b in the LED die 44 are the same as the sapphire substrate 24a and the semiconductor layer 24b in the LED die 24 illustrated in FIG. 2. However, the LED electrode 44c of the LED die 44 differs from the LED electrode 24c of the LED die 21. In other words, in the LED device 41, the height of the bottom surface of the LED electrode 44c and the height of the bottom surface of the reflecting member 43 are equal. Further, the internal connecting electrodes 26a and 27a of the circuit substrate 28 are connected with the LED electrode 44c via the connecting member 45.

As in the LED device 21, the reflecting member 43 is formed by kneading reflecting fine particles of alumina or titanium oxide in a silicone resin and curing the silicone resin, and the reflecting member 43 has a thickness of about 100 μm at the side surface part. However, the reflecting member 43 is thin at the bottom surface part where the thickness is about 10 μm. The main purpose of the reflecting member 43 at the bottom surface part is to cover the pinhole of the insulating film (or the protective film) at the bottom surface of the LED die 44. It is difficult to perfectly remove the pinhole from the insulating film, and therefore, by covering the pinhole in the insulating film by the reflecting member 43, trouble that occurs in relation to the pinhole, such as migration, is avoided. The reflecting member 43 at the bottom surface part of the LED die 44 also has the function to block light that tends to leak from the bottom part of the LED die 44.

As described previously, in the LED device 41, the height of the bottom surface of the LED electrode 44c and the height of the bottom surface of the reflecting member 43 are equal. There arises no problem even if the LED electrode 44c protrudes somewhat from the reflecting member 43, but in order to make the same the heights of the bottom surfaces, it is recommended to grind the LED electrode 44c and the reflecting member 43 in the stage before the joining process illustrated in FIG. 3E. Further, in order to cover the bottom surface part of the LED die 24 with the reflecting member 43, it is recommended to slightly sink the LED electrode 44c into the adhesive layer 31 or to prevent the LED electrode 44c from sinking into the adhesive layer 31 in the element array process illustrated in FIGS. 3A and 3B.

The phosphor sheet 42 is obtained by stretching a silicone resin containing a phosphor into the shape of a sheet and then curing the silicone resin, as in the LED device 21, and the phosphor sheet 42 has a thickness of about 100 μm.

Figure 3:
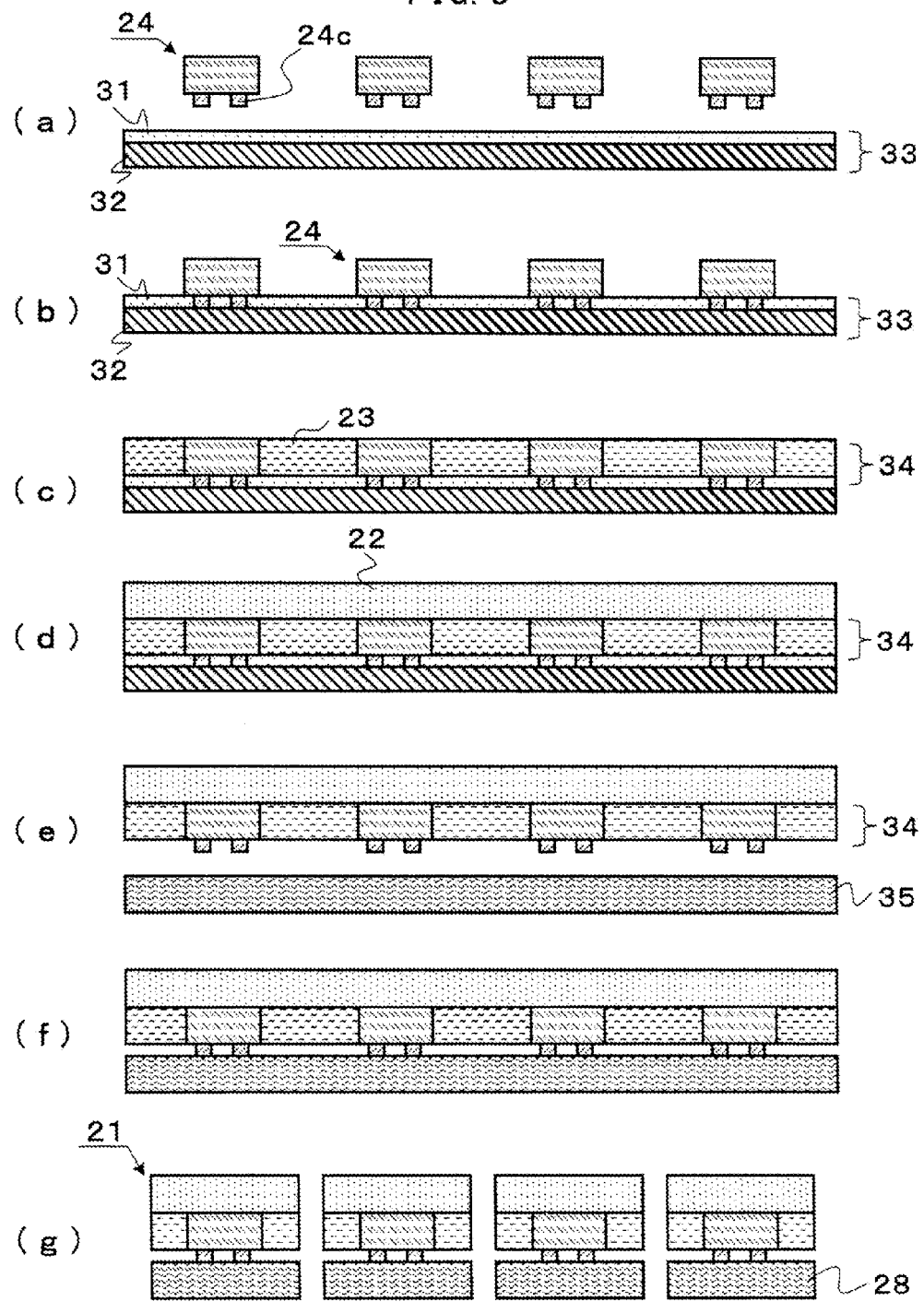
FIG. 3 is a diagram illustrating a manufacturing process of the LED device 21.

The manufacturing process of the LED device 41 is explained below by using FIG. 3.

First, the same process as that in FIG. 3A is performed, but the phosphor sheet 42 is caused to adhere to the LED die 44 in advance. In order to cause the phosphor sheet 42 to adhere only to the top surface of the LED die 44, it is recommended to bond the large-sized phosphor sheet 42 to the wafer (wafer including large-sized sapphire) before division into individual pieces of the LED die 44 and then to divide the wafer into the individual LED dies 44.

Next, in the process corresponding to FIG. 3B, the LED dies 44 are arranged on the adhesive layer 31 in such a manner as to provide a gap between the bottom surface of the LED die 44 and the adhesive layer 31.

Next, in the process corresponding to FIG. 3C, the spaces between the LED dies 44 are filled with the reflecting member 43 so that the reflecting member 43 enters the gap between the LED die 44 and the adhesive layer 31. Until the side surface of the phosphor sheet 42 is reached, filling of the reflecting member 43 is performed. After that, the reflecting member 43 is cured.

Onto the LED die 44, the phosphor sheet 42 is already bonded, and therefore, the phosphor layer forming process in FIG. 3D is no longer necessary. After that, through the same processes as those in FIG. 3E to FIG. 3G, the LED device 41 is obtained.

Figure 6:
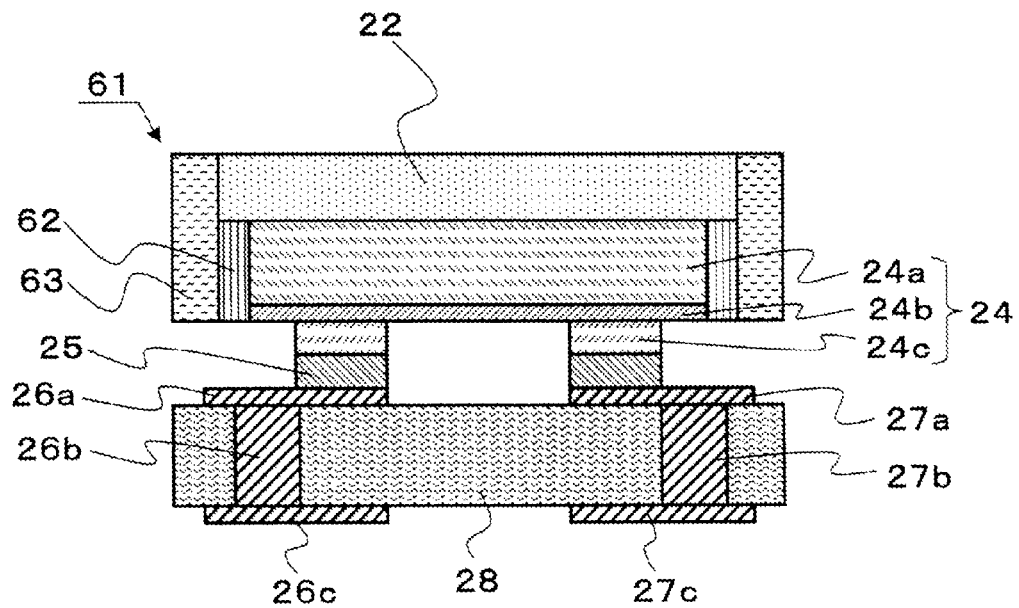
FIG. 6 is a section view of still another LED device 61.

FIG. 6 is a section view of still another LED device 61.

In the LED devices 21 and 41 described previously, the reflecting members 23 and 43 are in contact with the side surfaces of the LED dies 24 and 44, and therefore, light emitted in the lateral direction from the sapphire substrates 24a and 44a is reflected from the reflecting members 23 and 43 and returns to the sapphire substrates 24a and 44a. Part of the light is absorbed again by the light emitting layer or becomes stray light. Consequently, in the following, the LED device 61 having enabled improvement of the above-described points is explained. In FIG. 6, the same reference numerals are attached to the same components as those in the LED device 21 illustrated in FIG. 1 and explanation thereof is omitted.

As illustrated in FIG. 6, in the LED device 61, the side surface of the LED die 24 is covered with a translucent resin 62 and the phosphor sheet 22 is bonded to the top surface of the LED die 24 and to the top part of the translucent resin 62.

Further, the side surfaces of the phosphor sheet 22 and the translucent resin 62 are covered with a reflecting member 63.

The translucent resin 62 is a transparent resin, such as silicone, or a phosphor resin obtained by causing a transparent resin, such as silicone, to contain a phosphor. Light emitted in the lateral direction from the sapphire substrate 24*a* passes through the translucent resin 62 and is diffusely reflected from the reflecting member 63. Part of the diffusely-reflected light propagates through the inside of the translucent resin 62, passes through the phosphor sheet 22, and then is emitted to the outside of the LED device 61. In other words, the components of light that return to the sapphire substrate 24*a* and are absorbed again by the light emitting layer or become stray light reduce in number, and therefore, the loss of light is improved in the LED device 61.

Figure 7:
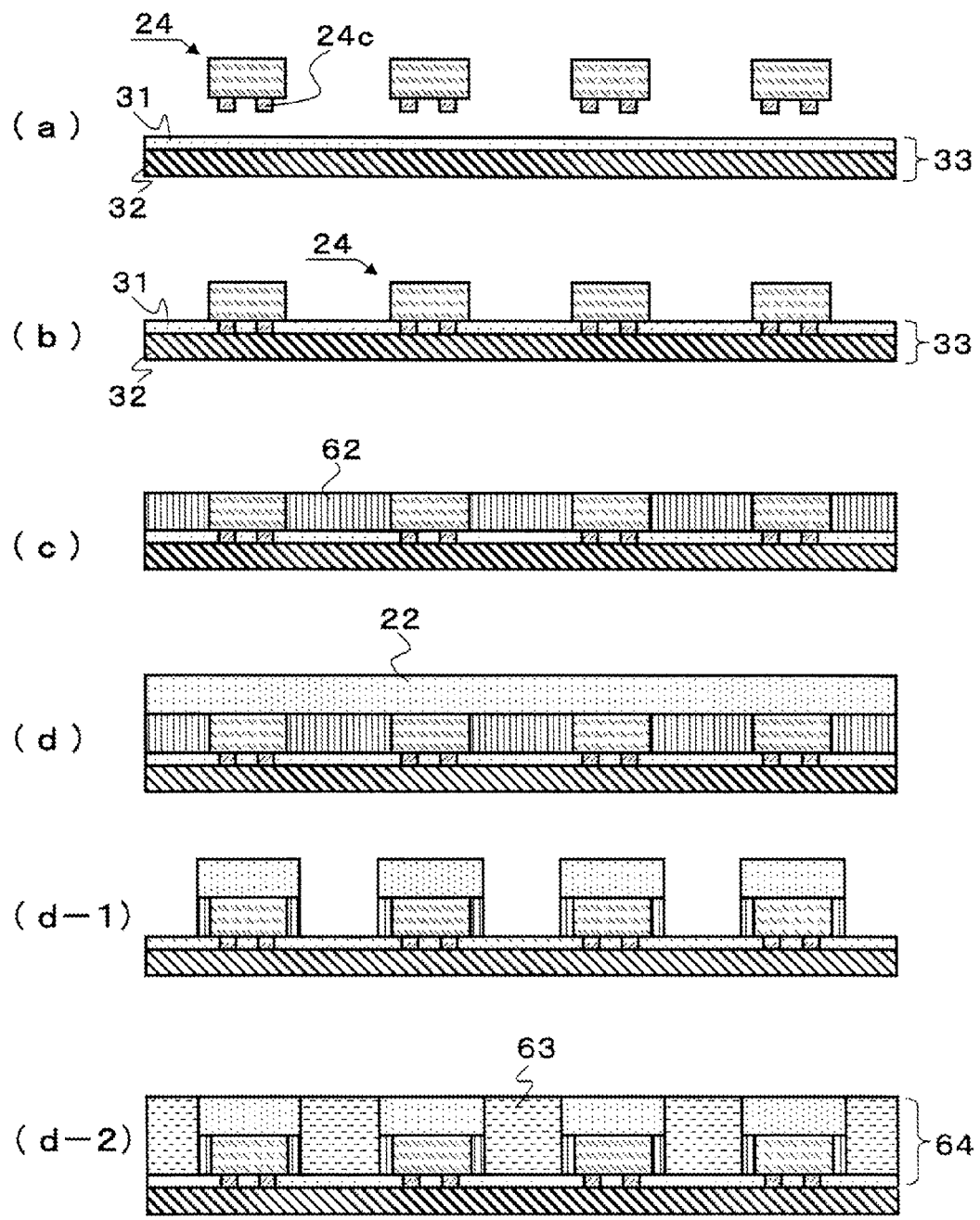
FIG. 7 is a diagram illustrating a manufacturing process of the LED device 61 (1).

FIG. 7A to FIG. 7(D-2) and FIG. 8A to FIG. 8C are diagrams illustrating the manufacturing process of the LED device 61. In the drawings, the LED die 24 and the circuit substrate 28 are drawn in a simplified manner. In the manufacturing process, a large number of the LED devices 61 are manufactured at one time, but only the four LED dies 24 are illustrated for explanation in the drawings.

The processes illustrated in FIG. 7A and FIG. 7B are the same as the processes illustrated in FIG. 3A and FIG. 3B, i.e., the element array process.

Next, the spaces between the side surfaces of the LED dies 24 arrayed on the adhesive sheet 33 are filled with the translucent resin 62 and then the translucent resin 62 is cured (see FIG. 7C) (part of the element wafer creation process). The filling method of the translucent resin 62 in FIG. 7C is the same as the filling method of the reflecting member 23 illustrated in FIG. 3C.

Next, the phosphor sheet 22 is bonded to the top surface of the LED die 24 (see FIG. 7D) (part of the element wafer creation process). The bonding method of the phosphor sheet 22 in FIG. 7D is the same as the bonding method of the phosphor sheet 22 illustrated in FIG. 3D.

Next, the phosphor sheet 22 and the translucent resin 62 at the side part of the LED die 24 are removed in such a manner as to leave a layer including the translucent resin 62 on the side surface of the LED die 24 (see FIG. 7(D-1)) (part of the element wafer creation process). The removal of the phosphor sheet 22 and the translucent resin 62 at the side part of the LED die 24 is performed by dicing. At this time, the surface of the base material 32 of the adhesive sheet 33 may be slightly scraped.

Next, the portion from which the phosphor sheet 22 and the translucent resin 62 have been removed is filled with the reflecting member 63 (see FIG. 7(D-2)) (part of the element wafer creation process). The filling method of the reflecting member 63 in FIG. 7(D-2) is the same as the filling method of the reflecting member 23 illustrated in FIG. 3C. By the processes in FIG. 7A to FIG. 7(D-2), an LED wafer 64 (semiconductor light emitting element wafer) is completed. Different from the LED wafer 34 illustrated in FIG. 3, the LED wafer 64 illustrated in FIG. 7(D-2) is an aggregate in which the LED dies 24 are linked by the reflecting member 63 etc. and which includes a phosphor layer.

Next, the adhesive sheet 33 is peeled from the LED wafer 64 (see FIG. 8A), the LED wafer 64 is overlaid on the large-sized circuit substrate 25 from which the numerous circuit substrates 28 can be obtained by division into individual pieces, and the LED electrodes 24*c* and the electrodes (internal connecting electrodes 26*a* and 27*a* (see FIG. 6)) formed on the large-sized circuit substrate 35 are joined (see FIG. 8B) (joining process). The joining method of the LED wafer 64 and the large-sized circuit substrate 35 in FIG. 8B is the same as the joining method illustrated in FIG. 3E and FIG. 3F.

Finally, the large-sized circuit substrate 35 to which the LED wafer 64 has been joined is divided into individual pieces and thus the LED device 61 is completed (see FIG. 8C) (individualization process). The cutting method of the LED wafer 64 and the large-sized circuit substrate 35 in FIG. 8C is the same as the cutting method illustrated in FIG. 3G.

Figure 9:
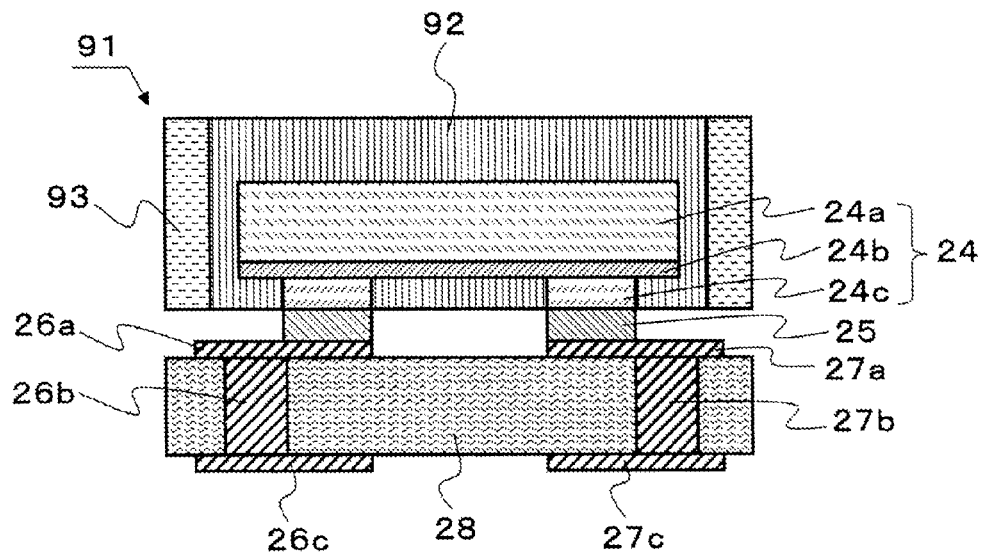
FIG. 9 is a section view of still another LED device 91.
Figure 10:
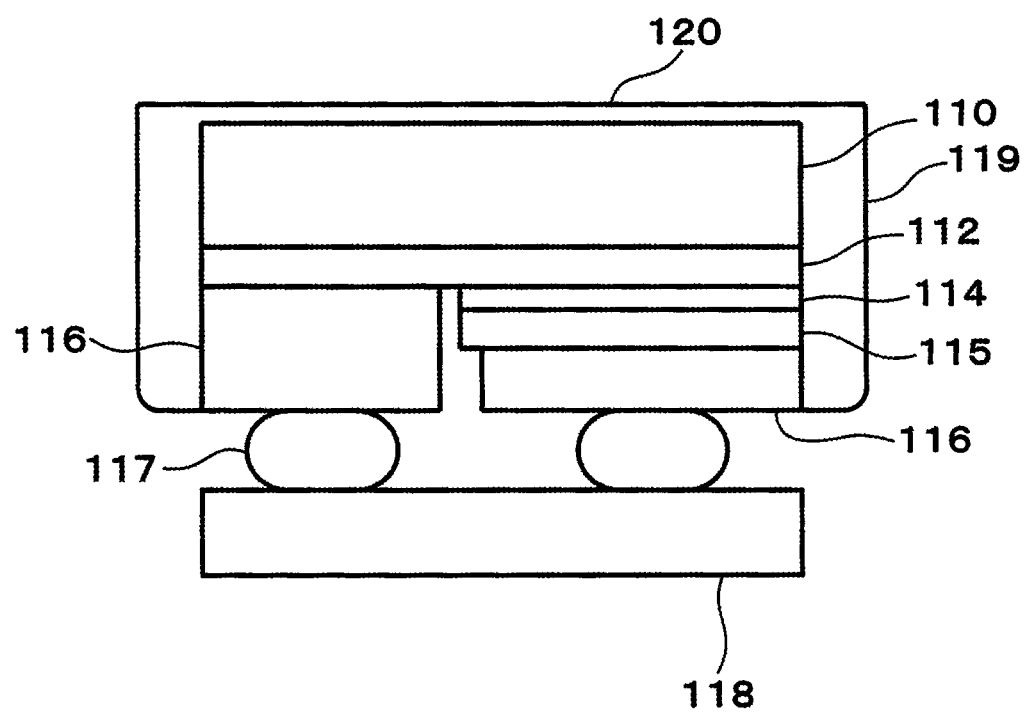
FIG. 10 is a section view illustrating a conventional light emitting diode.

FIG. 9 is a section view of still another LED device 91.

The LED device 61 described previously uses the phosphor layer that covers the top surface of the LED die 24 as the phosphor sheet 22 and includes the translucent resin 62 on the side surface of the LED die 24. In contrast to this, the LED device 91 (semiconductor light emitting device) to be explained below is configured so that the phosphor layer on the top surface of the LED die 24 and the translucent resin on the side surface of the LED die 24 are integrated and a protective layer is provided on the bottom surface of the LED die 24 while reducing the loss of light as in the LED device 61. In FIG. 9, the same reference numerals are attached to the same components as those of the LED device 21 illustrated in FIG. 1 and explanation thereof is omitted.

As illustrated in FIG. 9, in the LED device 91, the top surface, the side surface, and the undersurface of the LED die 24 are covered with a phosphor resin 92. Further, the side surface of the phosphor resin 92 is covered with a reflecting member 93.

The phosphor resin 92 is obtained by causing a transparent resin, such as silicone, to contain a phosphor. As in the LED device 61 described previously, in the LED device 91 also, light emitted in the lateral direction from the sapphire substrate 24*a* passes through the phosphor resin 92, is diffusely reflected from the reflecting member 93, and part of the diffusely-reflected light propagates through the inside of the phosphor resin 92, and is emitted to the outside of the LED device 91. In other words, the components of light that return to the sapphire substrate 24*a* and are absorbed again by the light emitting layer or become stray light reduce in number, and therefore, in the LED device 91, the loss of light is improved. Further, in the LED device 91, light traveling downward from the light emitting layer is wavelength-converted in the phosphor resin 92 at the bottom part and emitted to the outside, and part of the emitted light travels upward, and therefore, the light emission efficiency of the LED device 91 is somewhat improved than the light emission efficiency of the LED device 61.

Figure 8:
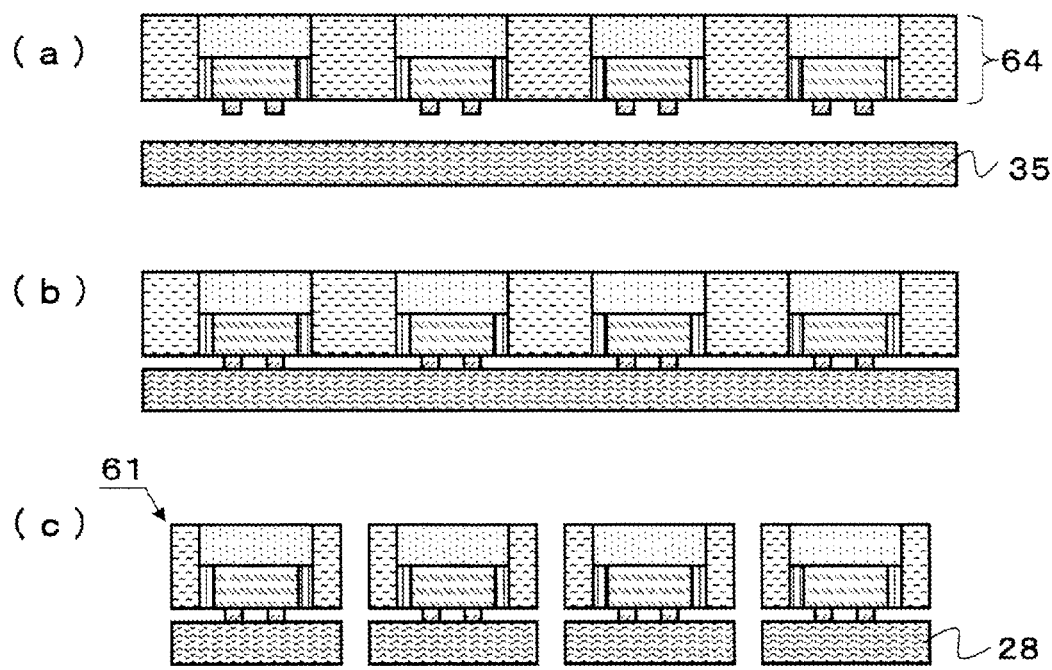
FIG. 8 is a diagram illustrating the manufacturing process of the LED device 61 (2).

The manufacturing process of the LED device 91 is explained below by using FIG. 7 and FIG. 8.

After being subjected to the same process as that in FIG. 7A, in the process corresponding to that in FIG. 7B, the LED dies 24 are arranged on the adhesive layer 31 in such a manner as to provide a gap between the bottom surface of the LED die 24 and the adhesive layer 31.

Next, in the process corresponding to that in FIG. 7C, the spaces between the LED dies 24 are filled with the phosphor resin 92, the top surface of the LED die 24 is covered with the phosphor resin 92 so that the phosphor resin 92 has a predetermined thickness, and the phosphor resin 92 is caused to enter the gap between the LED die 24 and the adhesive layer 31. After that, the phosphor resin 92 is cured. Next, through the same processes as those in FIG. 7D to FIG. 7(D-2), an LED wafer is completed. Next, through the same processes as those in FIG. 8A to FIG. 8C, the LED device 91 is obtained.

EXPLANATIONS OF LETTERS OR NUMERALS

21, 41, 61, 91 LED device (semiconductor light emitting device)

22, 42 phosphor sheet (phosphor layer)
23, 43, 63, 93 reflecting member
24, 44 LED die (semiconductor light emitting element)
24a, 44a sapphire substrate
24b, 44b semiconductor layer
24c, 44c LED electrode (electrode of semiconductor light emitting element)
25, 45 connecting member
26a, 27a internal connecting electrode (electrode formed on circuit substrate)
26b, 27b through-hole electrode
26c, 27c external connecting electrode
28 circuit substrate
31 adhesive layer
32 base material
33 adhesive sheet
34, 64 LED wafer (semiconductor light emitting element wafer)
35 large-sized circuit substrate
62 translucent resin
92 phosphor resin

What is claimed is:

1. A method for manufacturing a semiconductor light emitting device including a semiconductor light emitting element having electrodes, an individual circuit substrate mounting the semiconductor light emitting element, and a phosphor layer that converts the wavelength of light emitted from the semiconductor light emitting element, the method comprising the steps of
arraying the semiconductor light emitting elements on an adhesive sheet with a plurality of electrodes of the semiconductor light emitting elements being caused to face an adhesive sheet side;
filling spaces between side surfaces of the semiconductor light emitting elements arrayed on the adhesive sheet with a translucent resin;
creating a semiconductor light emitting element wafer by curing the translucent resin;
forming the phosphor layer at top part of the semiconductor light emitting elements and the translucent resin;
removing the phosphor layer and the translucent region at side part of the semiconductor light emitting elements in such a manner as to leave a layer including the translucent resin on the side surfaces of the semiconductor light emitting elements;
filling the portion from which the phosphor layer and the translucent resin at the side part of the semiconductor light emitting elements have been removed with a reflecting member;
peeling the adhesive sheet from the semiconductor light emitting element wafer;
overlaying the semiconductor light emitting element wafer on a large-sized circuit substrate from which the numerous individual circuit substrates can be obtained by division into individual pieces, and then joining the electrodes of the semiconductor light emitting elements and electrodes formed on the large-sized circuit substrate; and
dividing the large-sized circuit substrate to which the semiconductor light emitting element wafer has been joined into the individual semiconductor light emitting devices having the individual circuit substrate.

2. The method for manufacturing a semiconductor light emitting device according to claim 1, wherein the phosphor layer is a phosphor sheet containing a phosphor.

3. A method for manufacturing a semiconductor light emitting device including a semiconductor light emitting element having electrodes, an individual circuit substrate mounting the semiconductor light emitting element, and a phosphor layer that converts the wavelength of light emitted from the semiconductor light emitting element, the method comprising the steps of:
arraying the semiconductor light emitting elements on an adhesive sheet with a plurality of electrodes of the semiconductor light emitting elements being caused to face an adhesive sheet side;
filling spaces between side surfaces of the semiconductor light emitting elements arrayed on the adhesive sheet with a phosphor resin containing a phosphor,
creating a semiconductor light emitting element wafer by curing the phosphor resin;
forming the phosphor layer on the top surfaces of the semiconductor light emitting elements by the phosphor resin;
removing the phosphor resin at side part of the semiconductor light emitting elements in such a manner as to leave a layer including the phosphor resin on the side surfaces of the semiconductor light emitting elements;
filling the portion from which the phosphor resin at the side part of the semiconductor light emitting elements has been removed with a reflecting member;
peeling the adhesive sheet from the semiconductor light emitting element wafer;
overlaying the semiconductor light emitting element wafer on a large-sized circuit substrate from which the numerous individual circuit substrates can be obtained by division into individual pieces, and then joining the electrodes of the semiconductor light emitting elements and electrodes formed on the large-sized circuit substrate; and
dividing the large-sized circuit substrate to which the semiconductor light emitting element wafer has been joined into the individual semiconductor light emitting devices having the individual circuit substrate.

4. The method for manufacturing a semiconductor light emitting device according to claim 3, wherein spaces between the adhesive sheet and the semiconductor light emitting elements are filled with the phosphor resin.

* * * * *